(12) United States Patent
Wilson et al.

(10) Patent No.: US 8,717,099 B2
(45) Date of Patent: May 6, 2014

(54) WIDEBAND DOHERTY AMPLIFIER CIRCUIT WITH PEAKING IMPEDANCE ABSORPTION

(75) Inventors: Richard Wilson, Morgan Hill, CA (US); Saurabh Goel, Campbell, CA (US)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 13/422,938

(22) Filed: Mar. 16, 2012

(65) Prior Publication Data

US 2013/0241639 A1 Sep. 19, 2013

(51) Int. Cl.
*H03F 3/68* (2006.01)

(52) U.S. Cl.
USPC ...................... 330/124 R; 330/295

(58) Field of Classification Search
USPC ...................... 330/124 R, 126, 295
See application file for complete search history.

(56) References Cited

U.S. PATENT DOCUMENTS

| | | |
|---|---|---|
| 6,700,444 B2 | 3/2004 | Pengelly |
| 6,791,417 B2 | 9/2004 | Pengelly et al. |
| 7,109,790 B2 | 9/2006 | Kwon et al. |
| 7,541,866 B2 | 6/2009 | Bowles et al. |
| 7,688,135 B2 | 3/2010 | Kim et al. |
| 7,936,212 B2 | 5/2011 | Pengelly |
| 8,022,760 B2 | 9/2011 | Gajadharsing et al. |
| 8,022,768 B1 | 9/2011 | Bowles et al. |
| 8,193,857 B1 * | 6/2012 | Wilson ................. 330/124 R |
| 2009/0085667 A1 | 4/2009 | Krvavac |
| 2010/0188147 A1 | 7/2010 | Blednov et al. |
| 2010/0315162 A1 | 12/2010 | Gajadharsing et al. |
| 2011/0169590 A1 | 7/2011 | Namerikawa et al. |
| 2012/0126890 A1 * | 5/2012 | Svechtarov ............ 330/124 R |
| 2013/0099866 A1 * | 4/2013 | Conradi .................... 330/295 |

OTHER PUBLICATIONS

J.H. Wureshi et al., "A Wide-Band 20WLMOS Doherty Power Amplifier". IMS, 2010. pp. 1504-1507. IEEE, Netherlands.

Marco J. Pelk et al. "A High-Efficiency 100-W GaN Three-Way Doherty Amplifier for Base-Station Applications." IEEE Transactions on Microwave Theory and Techniques. pp. 1-10. IEEE, Jun. 2008.

Bummsn Kim et al. "Microwave Dohrty Power Amplifier for High Efficiency and Linearity." Invited Paper, Department of Electrical Engineering, Pohang University of Science and Technology (POSTECH). pp. 1-4. Pohang, Gyeungbuk, Republic of Korea, Jan. 2006.

John Gajadharsing "3-Way Doherty Amplifier Design." Company Confidential, NXP. pp. 1-58. NXP, Jul. 2011.

(Continued)

*Primary Examiner* — Khanh V Nguyen
(74) *Attorney, Agent, or Firm* — Murphy, Bilak & Homiller, PLLC (57) ABSTRACT

A wideband Doherty amplifier circuit includes a main amplifier configured to operate in a linear mode, a peaking amplifier configured to operate in a non-linear mode and a Doherty combiner directly connected to an output of each amplifier so that no output match devices are in the path between the amplifier outputs and the Doherty combiner. The Doherty combiner is configured to present the same load impedance to each amplifier when both amplifiers are conducting and present a modulated load impedance to the main amplifier when the peaking amplifier is non-conducting so that a variation in the VSWR seen by the main amplifier is less than 5% over a plurality of frequency bands and/or so that the peaking amplifier has an off-state impedance spreading of 20 degrees or less over the plurality of frequency bands.

18 Claims, 4 Drawing Sheets

(56) References Cited

OTHER PUBLICATIONS

Richard Wilson et al. "Wideband Doherty Amplifier Circuit Having a Constant Impedance Combiner." U.S. Appl. No. 13/163,388, filed Jun. 17, 2011.

Richard Wilson. "Wideband Doherty Amplifier Circuit." U.S. Appl. No. 13/037,813, filed Mar. 1, 2011.

Richard Wilson et al. "RF Device with Compensatory Resonator Matching Topology." U.S. Appl. No. 13/246,344, filed Sep. 27, 2011.

* cited by examiner

WIDEBAND DOHERTY AMPLIFIER CIRCUIT WITH PEAKING IMPEDANCE ABSORPTION

BACKGROUND

A typical Doherty amplifier has a main (carrier) amplifier biased to operate in a linear mode such as Class AB mode and a peaking (or auxiliary) amplifier biased to operate in a non-linear mode such as Class C mode. The signal input to the Doherty amplifier is split to each amplifier, and the amplified signals are recombined using a Doherty combiner. Both amplifiers are operational when the input signal peaks, and are each presented with the optimum load impedance to yield maximum power output. As the input signal decreases in power, the peaking amplifier turns off and only the main amplifier operates. At these lower power levels, the Doherty combiner presents the main amplifier with a modulated load impedance that enables higher efficiency and gain. This results in an efficient solution for amplifying complex modulation schemes employed in current and emerging wireless systems e.g. such as WCDMA (Wideband CDMA), CDMA2000, and systems employing Orthogonal Frequency Division Multiplexing (OFDM), such as WiMAX (World-wide Interoperability for Microwave Access) and the Long-Term Evolution (LTE) enhancement to the UMTS (Universal Mobile Telecommunications System) standard.

However, if high efficiency at a high OBO (output back-off) is required as is the case with many high peak-to-average power (PAR) applications, a highly asymmetric ratio between the size of the main and peaking amplifiers is required. With such an architecture, the efficiency between the peak OBO point where the main amplifier is conducting and the peaking amplifier is not conducting, and the peak power point where both amplifiers are conducting degrades significantly which is undesirable. A three-way Doherty architecture can be used to overcome this problem.

A three-way Doherty amplifier circuit typically includes a main amplifier which operates in a linear mode (e.g. Class AB mode) and two peaking amplifiers which operate in a non-linear mode (e.g. Class B or Class C mode). The three-way Doherty circuit has three power operating points: a peak power point where all three amplifiers are conducting; a first peak OBO point (back-off 1) where the main amplifier and the first peaking amplifier are conducting and the second peaking amplifier is not conducting; and a second peak OBO point (back-off 2) where the main amplifier is conducting and both peaking amplifiers are not conducting. Each amplifier stage is typically optimized as a 50Ω block, and the Doherty combiner is designed to provide the correct load impedances to each amplifier at back-off 1, back-off 2 and full power.

Each amplifier is conventionally connected to the Doherty combiner using an impedance match device such as an impedance transformer. The output match devices which connect the peaking amplifiers to the Doherty combiner cause an off-state impedance spreading effect across frequency when the peaking amplifiers are not amplifying. The off-state impedance spreading changes the VSWR (voltage standing wave ratio) seen by the main amplifier across frequency, and that de-tunes the main amplifier from the optimal load over a wide bandwidth. This in turn limits the overall bandwidth of operation for the three-way Doherty amplifier circuit. Doherty amplifier circuits are typically designed for a specific narrow frequency range of operation such as 1805-1880 MHz, 1930-1990 MHz, etc. Narrow band circuits are affected by the off-state impedance spreading and therefore cannot be operated across wider bandwidths.

SUMMARY

According to an embodiment of a wideband Doherty amplifier circuit, the circuit includes a main amplifier configured to operate in a linear mode such as class AB mode, a peaking amplifier configured to operate in a non-linear mode such as class B or class C mode and a Doherty combiner directly connected to an output of each amplifier so that no output match devices are in the path between the amplifier outputs and the Doherty combiner. The Doherty combiner is configured to present an optimal load impedance to each amplifier when both amplifiers are amplifying and present a modulated load impedance to the main amplifier when the peaking amplifier is not amplifying so that the variation in the voltage standing wave ratio (VSWR) seen by the main amplifier is less than 5% over a plurality of frequency bands.

According to another embodiment of a wideband Doherty amplifier circuit, the circuit includes a main amplifier configured to operate in a linear mode such as class AB mode, a peaking amplifier configured to operate in a non-linear mode such as class B or class C mode and a Doherty combiner directly connected to an output of each amplifier so that no output match devices are in the path between the amplifier outputs and the Doherty combiner. The Doherty combiner is configured to present the optimal load impedance to each amplifier when both amplifiers are amplifying and present a modulated load impedance to the main amplifier when the peaking amplifier is not amplifying so that the peaking amplifier has an off-state impedance spreading of 20 degrees or less over a plurality of frequency bands.

According to yet another embodiment of a wideband Doherty amplifier circuit, the circuit includes a main amplifier configured to operate in a linear mode such as class AB mode and having an optimum output impedance Z1 and size T1, a peaking amplifier configured to operate in a non-linear mode such as class C mode and having an optimum output impedance Z2 and size T2, and a Doherty combiner comprising a transmission line having an impedance Z3 directly connected to the output of the main amplifier at one end and directly connected to the output of the peaking amplifier at an opposing end so that no output match devices are in the path between the amplifier outputs and the Doherty combiner, with $$Z3 = \left(Z1 \times Z2 \times \frac{T2}{T1}\right)^{\frac{1}{2}}.$$

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
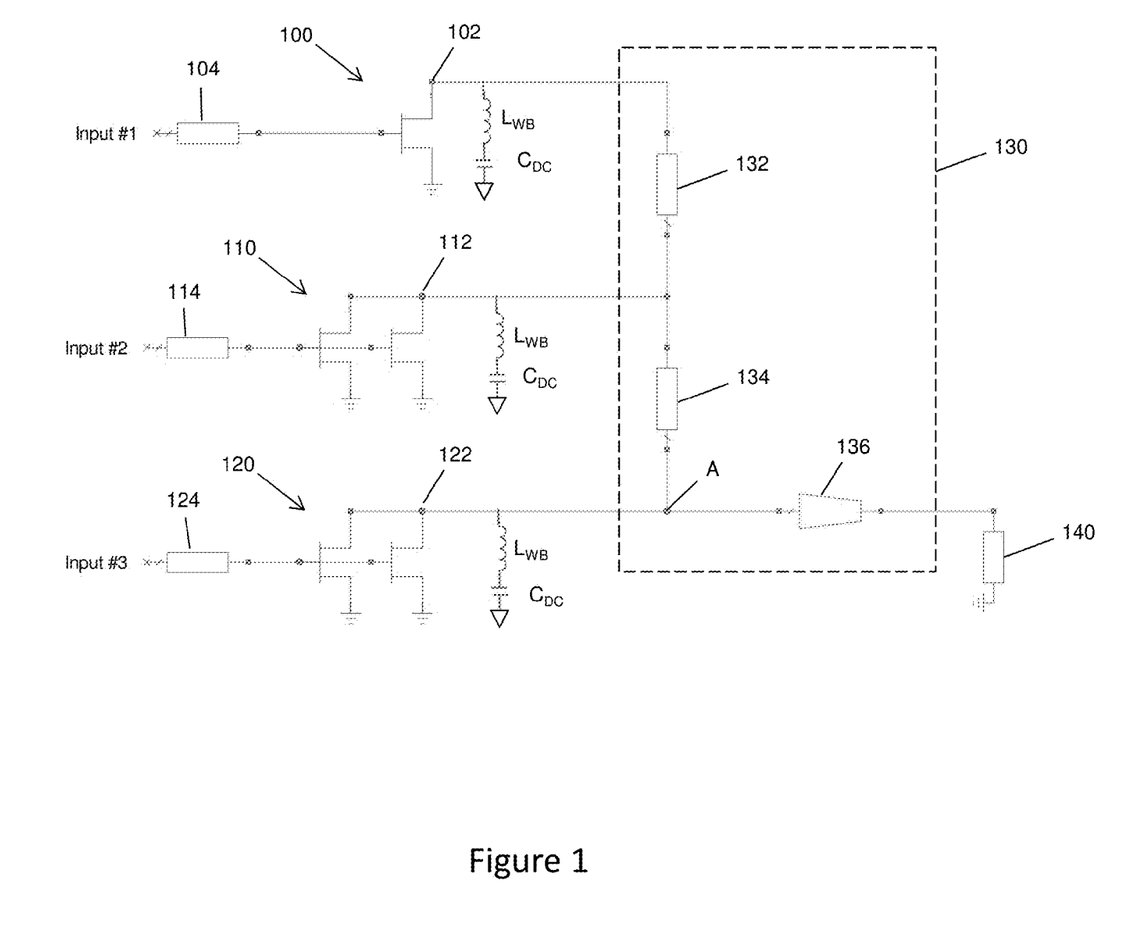
FIG. 1 illustrates a circuit schematic of a three-way Doherty amplifier circuit with a direct-connected Doherty combiner.

FIG. 1 illustrates an embodiment of a wideband three-way Doherty amplifier circuit. The three-way Doherty amplifier circuit includes a main amplifier 100 configured to operate in a linear mode such as Class AB mode, a first peaking amplifier 110 configured to operate in a non-linear mode such as Class C mode, a second peaking amplifier 120 configured to operate in a non-linear mode such as Class C mode, and a Doherty combiner 130 which connects the amplifier outputs 102, 112, 122 to a load 140. The three-way Doherty circuit has three power operating points: a peak power point where all three amplifiers 100, 110, 120 are amplifying; a first peak OBO point (back-off 1) where the main amplifier 100 and the first peaking amplifier 110 are amplifying the input signal (generically represented by 'input #1', 'input #2' and 'input #3' in FIG. 1) and the second peaking amplifier 120 is not amplifying; and a second peak OBO point (back-off 2) where the main amplifier 100 is amplifying and both peaking amplifiers 110, 120 are not amplifying.

The Doherty combiner 130 presents an optimal load impedance to each amplifier 100, 110, 120 when all amplifiers 100, 110, 120 are amplifying, and presents a modulated load impedance to the main amplifier 100 when one or both of the peaking amplifiers 110, 120 are not amplifying. Input matching devices 104, 114, 124 may be provided at the input side. At the output side, the Doherty combiner 130 is directly connected to the amplifier outputs 102, 112, 122 so that no output match devices are in the path between the amplifier outputs 102, 112, 122 and the Doherty combiner 130. For example, other devices such a DC blocking capacitor ($C_{DC}$) may be wire bonded between the amplifier outputs 1012, 112, 122 and ground as shown in FIG. 1 where the wire bonds are represented by inductors ($L_{WB}$). An additional DC blocking capacitor (not shown) may be wire bonded connected in the path between the amplifier outputs 102, 112, 122 and the Doherty combiner 130. However, no peaking amplifier output match devices are in the path between the amplifier outputs 102, 112, 122 and the Doherty combiner 130. Instead, the peaking amplifier output match is absorbed into the Doherty combiner 130 so that no output match devices are needed. By absorbing the peaking amplifier output match in this way, off-state impedance spreading is greatly reduced and the VSWR seen by the main amplifier 100 stays relatively constant over a wider bandwidth.

As such, the three-way Doherty amplifier circuit has less off-state impedance spreading which is particularly beneficial for wideband applications. Consequently, the three-way Doherty amplifier circuit can be operated over a wider bandwidth as compared to a conventional narrowband three-way Doherty amplifier circuit where each peaking amplifier has an output match which exacerbates the off-state impedance spreading for each of the peaking amplifiers. That is, the main amplifier 100 can provide more constant power and efficiency over a wider frequency range at a fixed back-off output power level. The Doherty amplifier circuit is therefore particularly well-suited for multi-band operation in that more than one frequency band can be serviced by the same amplifier circuit. For purely illustrative purposes, the Doherty amplifier circuit can service a first frequency band of 1805-1880 MHz and a second frequency band of 1930-1990 MHz. Other frequency bands can also be supported. According to one embodiment, the VSWR seen by the main amplifier 100 varies by less than 5% or by less than 3% over a plurality of frequency bands. In another embodiment, the peaking amplifiers 110, 120 have off-state impedance spreading of 20 degrees or less over a plurality of frequency bands.

In more detail, the main amplifier 100 has an optimal output impedance Z1 and size T1 (e.g. device periphery), the first peaking amplifier 110 has an optimal output impedance Z2 and size T2, and the second peaking amplifier 120 has an optimal output impedance Z4 and size T4. The Doherty combiner 130 includes a first transmission line 132 having an impedance Z3 directly connected to the output 102 of the main amplifier 100 at one end and directly connected to the output 112 of the first peaking amplifier 110 at an opposing end, and a second transmission line 134 having an impedance Z5 directly connected to the output 112 of the first peaking amplifier 110 at one end and directly connected to the output 122 of the second peaking amplifier 120 at an opposing end. In one embodiment, the transmission lines 132, 134 of the Doherty combiner 130 are directly connected through wire bonds to the corresponding amplifier outputs 102, 112, 122 at the respective ends.

In general, the impedance of the transmission lines 132, 134 of the Doherty combiner 130 are selected as a function of the optimal load impedance of the amplifiers 100, 110, 120, the size of the amplifiers 100, the output back-off (OBO) points, and the load impedance. The impedance of the transmission lines 132, 134 of the Doherty combiner 130 are given by:

$$Z3 = \left(Z1 \times Z2 \times \frac{T2}{T1}\right)^{\frac{1}{2}}, \quad (1)$$

$$Z5 = \left[\frac{Z2 \times Z4 \times \frac{T2}{T1} \times \frac{T4}{T1}}{\left(1 + \frac{T2}{T1}\right)^2}\right]^{1/2} \quad (2)$$

where Z3 is the impedance of the first transmission line 132 and Z5 is the impedance of the second transmission line 134. In one embodiment, Z1=2×Z2, T2=2×T1, Z2=Z4, and T2=T4. In addition, the impedance ZA at node A of the Doherty combiner 130 as shown in FIG. 1 is given by:

$$ZA = \left[\frac{Z4}{1 + \left(\frac{T1+T2}{T4}\right)}\right] \quad (3)$$

For purely illustrative purposes, the main amplifier 100 may be a 30 mm (size) Class AB amplifier having 10Ω optimal output impedance and both peaking amplifiers 110, 120 may be 60 mm Class C amplifiers having 5Ω optimal output impedance. In this case, Z3=10Ω, Z5=3.33Ω and ZA=2Ω.

The Doherty combiner 130 can also include a tapered impedance transformer 136 having a wider end connected to the output 122 of the second peaking amplifier 120 at node A of the Doherty combiner 130 and a narrower end connected to the load 140. In the example above, the tapered impedance transformer 136 provides a 2Ω to 50Ω impedance transformation where the load is 50Ω in this example. Other loads may be used e.g. a 75Ω load. In each case, the tapered impedance transformer 136 presents a real impedance to the main amplifier 100 over a plurality of frequency bands at back-off 1 and back-off 2 operating conditions i.e. when one or both of the peaking amplifiers 110, 120 are not amplifying. The wideband taper can be replaced by a 2-section transformer or a single section transformer. However, a single section transformer limits the performance but a 2-section or a 3-section transformer may perform similar to a wideband taper. Also, any sort of coupler on different materials or substrates can be used for this purpose.

Figure 2:
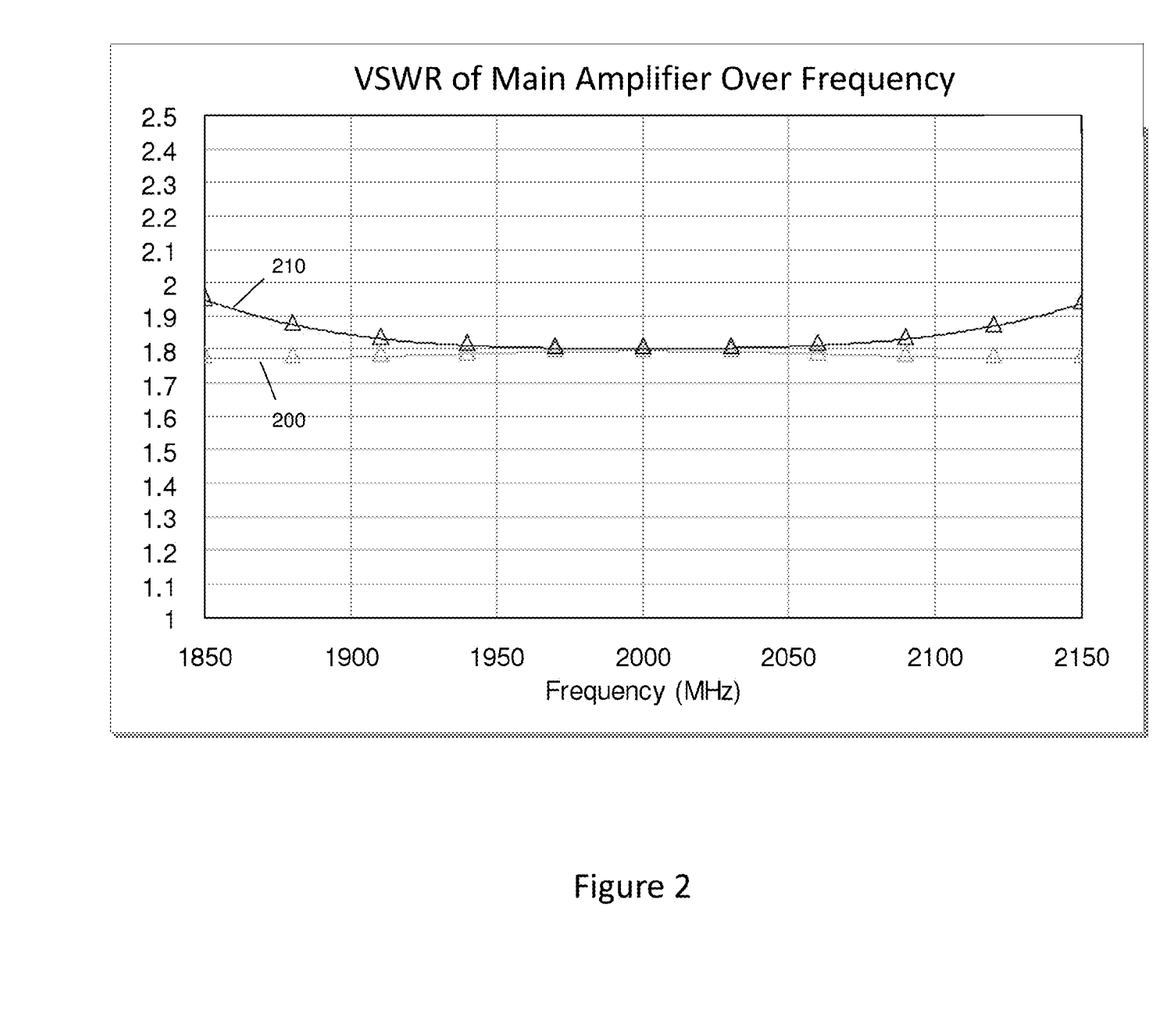
FIG. 2 illustrates a plot diagram of the VSWR seen by the main amplifier of the circuit shown in FIG. 1 over a particular wideband frequency range.

As shown in FIG. 2, the variation in VSWR seen by the main amplifier 100 is significantly reduced and varies by less 3% over a wideband frequency range of at least 200 MHz under the aforementioned conditions. FIG. 2 illustrates the VSWR seen by the main amplifier 100 over a wideband frequency range of at least 200 MHz for a 30 mm Class AB main amplifier 100 having 10Ω optimal output load impedance while two 60 mm Class C peaking amplifiers 110, 120 each having 5Ω optimal output load impedance are connected but not amplifying. Curve 200 represents the VSWR seen by the main amplifier 100 with the peaking amplifier outputs not connected to the Doherty combiner 130, and curve 210 represents the VSWR of the main amplifier 100 with both peaking amplifiers 110, 120 connected in the circuit, but not amplifying (i.e. the back-off 2 point which is most desirable point of operation for high peak-to-average ratio signals). In comparison, the VSWR seen by the main amplifier of a conventional three-way Doherty amplifier circuit which has an output impedance matching network between the peaking amplifier outputs and the Doherty combiner would vary much more significantly for the same frequency range and under the same conditions, rendering the conventional circuit undesirable for wideband applications. The Doherty amplifier circuit with the directly-connected Doherty combiner 130 as described herein provides improved VSWR performance for wideband applications at least in part to a reduced off-state impedance spreading over a wider frequency range.

Figure 3:
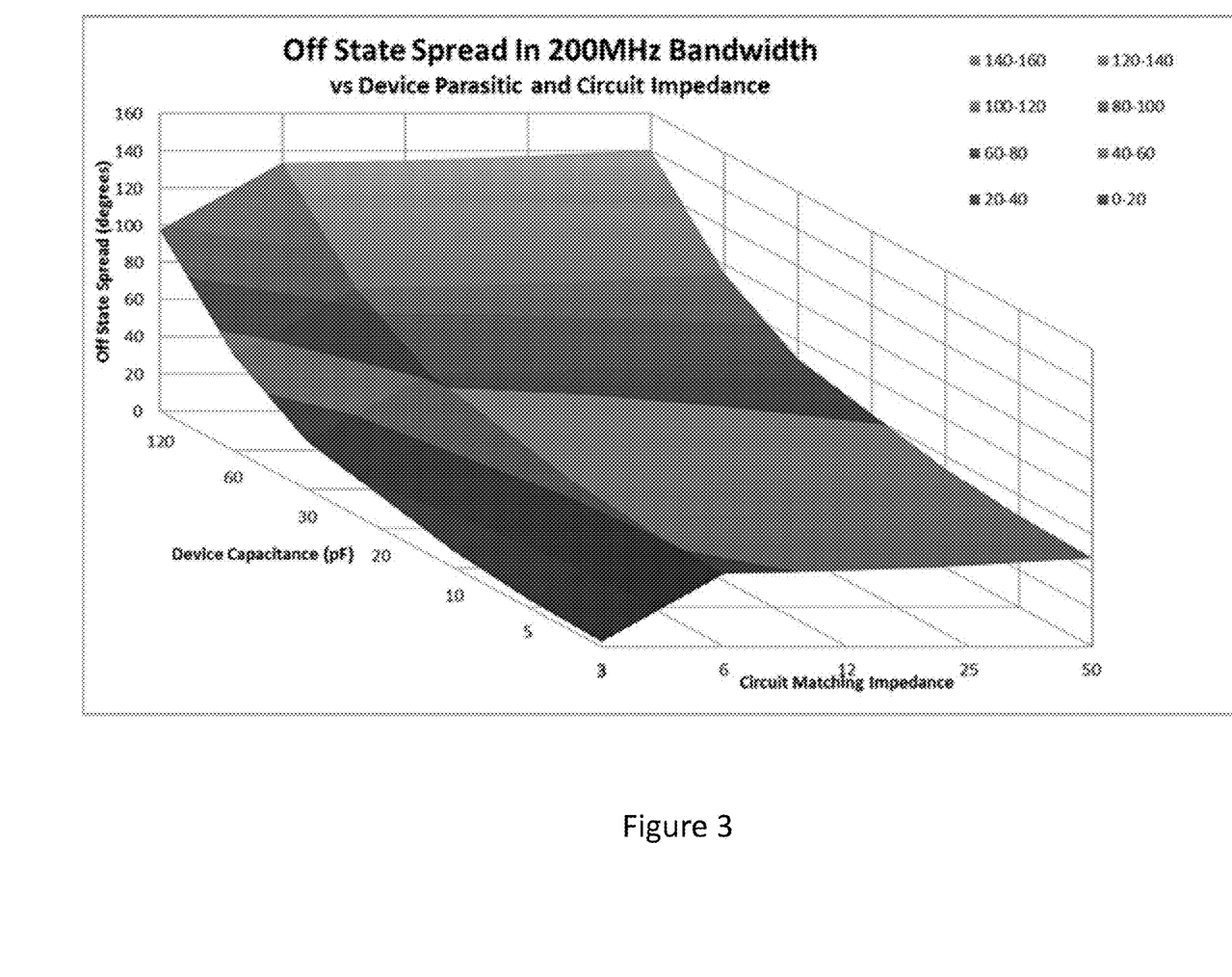
FIG. 3 illustrates a plot diagram of off-state impedance spreading over a particular wideband frequency range, with and without output impedance match networks.

FIG. 3 illustrates the relationship between the peaking amplifier matching impedance and the off-state impedance spreading for a 200 MHz bandwidth. Particularly, off-state impedance spreading (y-axis) is plotted as a function of circuit matching impedance (x-axis) and device capacitance (z-axis). The device matching impedance is 3Ω in this example. The term 'off-state' as used herein refers to the peaking amplifiers 110, 120 not amplifying (i.e. back-off 2). The plot shows that when the device load impedance is absorbed into the Doherty combiner 130 as described herein and no output impedance matching network is needed, the off-state impedance spreading is significantly reduced. This provides for improved wideband performance as compared to conventional Doherty amplifier circuits which have output impedance matching networks as represented by the data points between 6Ω and 50Ω along the x-axis. The Doherty amplifier circuit with the direct-connected Doherty combiner 130 has an off-state impedance spreading of 20 degrees or less over the 200 MHz bandwidth as represented by the 3Ω data point.

Figure 4:
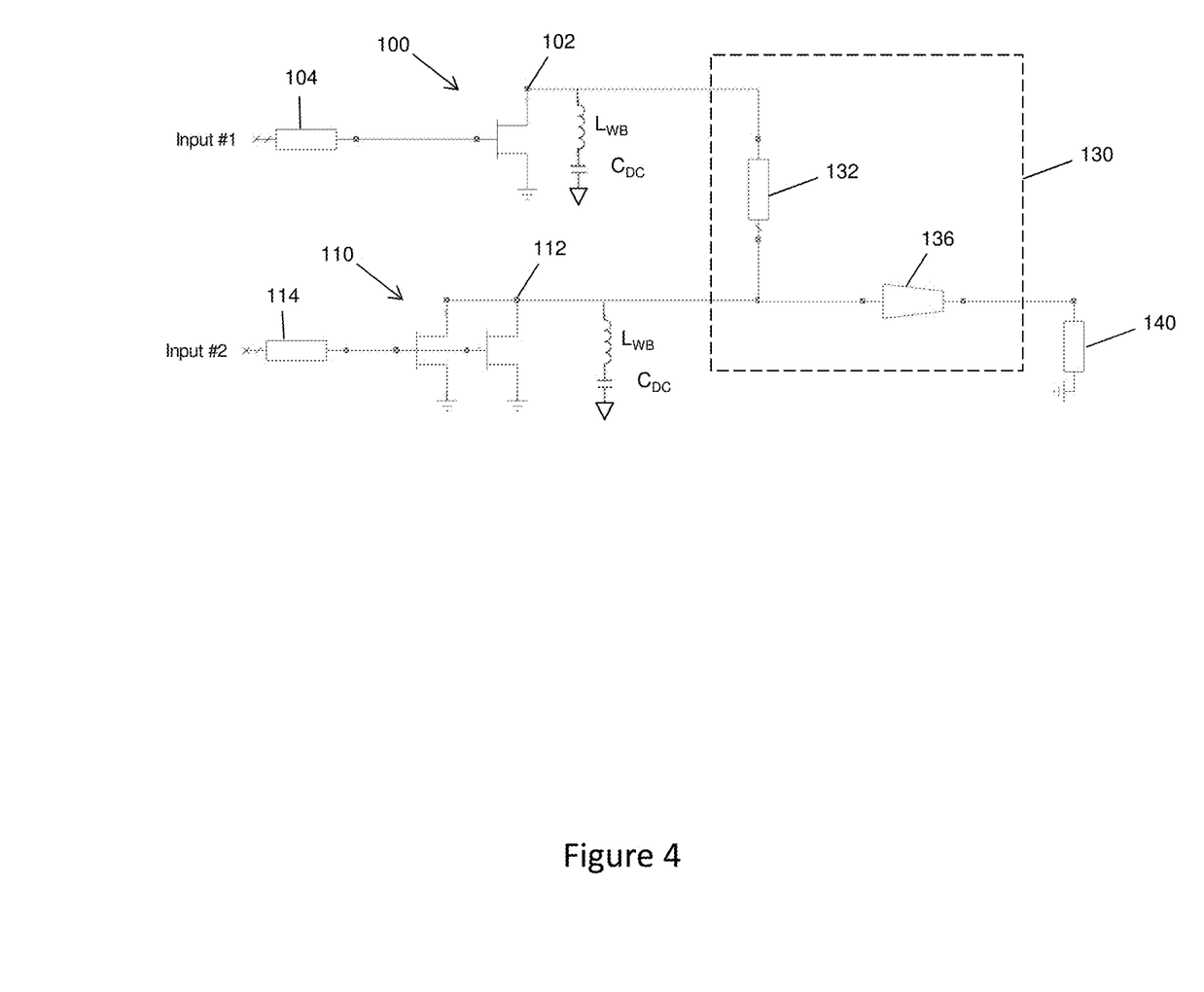
FIG. 4 illustrates a circuit schematic of a two-way Doherty amplifier circuit with a direct-connected Doherty combiner.

FIG. 4 illustrates an embodiment of a wideband two-way Doherty amplifier circuit. The two-way Doherty amplifier circuit is similar to the three-way Doherty amplifier circuit shown in FIG. 1, however one peaking amplifier 110 is provided instead of two. The Doherty combiner 130 includes a transmission line 132 having an impedance Z3 directly connected to the output 102 of the main amplifier 100 at one end and directly connected to the output 112 of the peaking amplifier 110 at an opposing end, and a tapered impedance transformer 136 having a wider end connected to the output 112 of the peaking amplifier 110 and a narrower end connected to the load 140. The transmission line 132 of the Doherty combiner 130 is selected in accordance with equation (1) above, where Z1 is the optimal output impedance of the main amplifier 100, T1 is the size of the main amplifier 100, Z2 is the optimal output impedance of the peaking amplifier 110, T2 is the size of the peaking amplifier 110 and Z3 is the transmission line impedance of the Doherty combiner 130. The Doherty combiner 130 does not include a second transmission line according to this embodiment, and therefore equation (2) is not applicable for this embodiment. As described previously herein, the transmission line 132 of the Doherty combiner 130 can be directly wire bonded to the outputs 102, 112 of the amplifiers 100, 110 at the respective ends. The VSWR seen by the main amplifier 100 varies by less than 5% or by less than 3% over a plurality of frequency bands e.g. 1805-1880 MHz and 1930-1990 MHz, and/or the peaking amplifier 110 has an off-state impedance spreading of 20 degrees or less over such frequency bands. The output impedance absorption approach described herein can be readily extended to any N-way Doherty amplifier circuit where N=2, 3, 4, etc. by determining the Doherty combiner impedances as a function of the optimal load impedance of the amplifiers, amplifier size, output back-off (OBO) points, and load impedance as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A wideband Doherty amplifier circuit, comprising:
a main amplifier configured to operate in a linear mode;
a peaking amplifier configured to operate in a non-linear mode; and
a Doherty combiner directly connected to an output of each amplifier so that no output match devices are in the path between the amplifier outputs and the Doherty combiner, the Doherty combiner configured to present the same load impedance to each amplifier when both amplifiers are amplifying and present a modulated load impedance to the main amplifier when the peaking amplifier is not amplifying so that the variation in a voltage standing wave ratio (VSWR) seen by the main amplifier is less than 5% over a plurality of frequency bands,
wherein the main amplifier has an optimal output impedance Z1 and size T1, the peaking amplifier has an optimal output impedance Z2 and size T2, the Doherty combiner comprises a transmission line having an impedance Z3 directly connected to the output of the main amplifier at one end and directly connected to the output of the peaking amplifier at an opposing end, and $$Z3 = \left(Z1 \times Z2 \times \frac{T2}{T1}\right)^{\frac{1}{2}}.$$

2. A wideband Doherty amplifier circuit according to claim 1, wherein the Doherty combiner is configured to ensure the variation in the VSWR seen by the main amplifier is less than 3% over the plurality of frequency bands.

3. A wideband Doherty amplifier circuit according to claim 1, wherein $Z1=2\times Z2$ and $T2=2\times T1$.

4. A wideband Doherty amplifier circuit according to claim 1, wherein the Doherty combiner further comprises a tapered impedance transformer having a wider end connected to the output of the peaking amplifier and a narrower end connected to a load.

5. A wideband Doherty amplifier circuit according to claim 1, further comprising an additional peaking amplifier configured to operate in a non-linear mode so that the wideband Doherty amplifier circuit has a first power mode corresponding to the main amplifier amplifying and the peaking amplifiers not amplifying, a second power mode corresponding to the main amplifier amplifying and one of the peaking amplifiers amplifying, and a third power mode corresponding to the main amplifier amplifying and both peaking amplifiers amplifying, wherein the Doherty combiner is configured to ensure the variation in the VSWR seen by the main amplifier is less than 5% over the plurality of frequency bands.

6. A wideband Doherty amplifier circuit according to claim 5, wherein the additional peaking amplifier has an optimal output impedance Z4 and size T4, the Doherty combiner further comprises an additional transmission line having an impedance Z5 directly connected to the output of the peaking amplifier at one end and directly connected to the output of the additional peaking amplifier at an opposing end, and $$Z5 = \left(\frac{Z2 \times Z4 \times \frac{T2}{T1} \times \frac{T4}{T1}}{\left[1+\frac{T2}{T1}\right]^2}\right)^{1/2}.$$

7. A wideband Doherty amplifier circuit according to claim 6, wherein $Z1=2\times Z2$, $T2=2\times T1$, $Z2=Z4$, and $T2=T4$.

8. A wideband Doherty amplifier circuit according to claim 6, wherein the Doherty combiner further comprises a tapered impedance transformer having a wider end connected to the output of the additional peaking amplifier and a narrower end connected to a load.

9. A wideband Doherty amplifier circuit, comprising:
a main amplifier configured to operate in a linear mode;
a peaking amplifier configured to operate in a non-linear mode;
a Doherty combiner directly connected to an output of each amplifier so that no output match devices are in the path between the amplifier outputs and the Doherty combiner, the Doherty combiner configured to present the optimal load impedance to each amplifier when both amplifiers are conducting and present a modulated load impedance to the main amplifier when the peaking amplifier is not amplifying so that the peaking amplifier has an off-state impedance spreading of 20 degrees or less over a plurality of frequency bands; and
an additional peaking amplifier configured to operate in a non-linear mode so that the wideband Doherty amplifier circuit has a first power mode corresponding to the main amplifier amplifying and the peaking amplifiers not amplifying, a second power mode corresponding to the main amplifier amplifying and one of the peaking amplifiers amplifying, and a third power mode corresponding to the main amplifier amplifying and both peaking amplifiers also amplifying, wherein the Doherty combiner is configured to ensure the peaking amplifiers have an off-state impedance spreading of 20 degrees or less over the plurality of frequency bands.

10. A wideband Doherty amplifier circuit, comprising:
a main amplifier configured to operate in a linear mode and having an optimal output impedance Z1 and size T1;
a peaking amplifier configured to operate in a non-linear mode and having an optimal output impedance Z2 and size T2; and
a Doherty combiner comprising a transmission line having an impedance Z3 directly connected to the output of the main amplifier at one end and directly connected to the output of the peaking amplifier at an opposing end so that no output match devices are in the path between the amplifier outputs and the Doherty combiner,
wherein $$Z3 = \left(Z1 \times Z2 \times \frac{T2}{T1}\right)^{\frac{1}{2}}.$$

11. A wideband Doherty amplifier circuit according to claim 10, wherein $Z1=2\times Z2$ and $T2=2\times T1$.

12. A wideband Doherty amplifier circuit according to claim 10, wherein the Doherty combiner further comprises a tapered impedance transformer having a wider end connected to the output of the peaking amplifier and a narrower end connected to a load.

13. A wideband Doherty amplifier circuit according to claim 10, further comprising an additional peaking amplifier configured to operate in a non-linear mode and having an optimal output impedance Z4 and size T4, wherein the Doherty combiner further comprises an additional transmission line having an impedance Z5 directly connected to the output of the peaking amplifier at one end and directly connected to the output of the additional peaking amplifier at an opposing end, and $$Z5 = \left(\frac{Z2 \times Z4 \times \frac{T2}{T1} \times \frac{T4}{T1}}{\left[1+\frac{T2}{T1}\right]^2}\right)^{1/2}.$$

14. A wideband Doherty amplifier circuit according to claim 13, wherein $Z1=2\times Z2$, $T2=2\times T1$, $Z2=Z4$, and $T2=T4$.

15. A wideband Doherty amplifier circuit according to claim 13, wherein the Doherty combiner further comprises a tapered impedance transformer having a wider end connected to the output of the additional peaking amplifier and a narrower end connected to a load.

16. A wideband Doherty amplifier circuit according to claim 10, wherein the Doherty combiner is configured to present the same load impedance to each amplifier when both amplifiers are conducting and present a modulated load impedance to the main amplifier when the peaking amplifier is non-conducting so that a variation in a voltage standing wave ratio (VSWR) seen by the main amplifier is less than 5% over the plurality of frequency bands.

17. A wideband Doherty amplifier circuit according to claim 10, wherein the Doherty combiner is configured to present the same load impedance to each amplifier when both amplifiers are conducting and present a modulated load impedance to the main amplifier when the peaking amplifier is non-conducting so that the peaking amplifier has an off-state impedance spreading of 20 degrees or less over the plurality of frequency bands.

18. A wideband Doherty amplifier circuit according to claim 10, wherein the transmission line of the Doherty combiner is directly wire bonded to the output of the main amplifier at one end and directly wire bonded to the output of the peaking amplifier at the other end.

\* \* \* \* \*